(12) United States Patent
Kim

(10) Patent No.: US 9,070,608 B2
(45) Date of Patent: Jun. 30, 2015

(54) IMAGE SENSOR

(71) Applicant: SK hynix Inc., Icheon-si Gyeonggi-do (KR)

(72) Inventor: Eun Jun Kim, Icheon-si (KR)

(73) Assignee: SK Hynix Inc., Gyeonggi-do (KR)

( * ) Notice: Subject to any disclaimer, the term of this patent is extended or adjusted under 35 U.S.C. 154(b) by 359 days.

(21) Appl. No.: 13/626,205

(22) Filed: Sep. 25, 2012

(65) Prior Publication Data

US 2013/0256511 A1 Oct. 3, 2013

(30) Foreign Application Priority Data

Apr. 3, 2012 (KR) .................. 10-2012-0034532

(51) Int. Cl.
| | |
|---|---|
| H03M 1/56 | (2006.01) |
| H01L 27/146 | (2006.01) |
| H04N 5/378 | (2011.01) |
| H03M 1/12 | (2006.01) |
| H04N 5/335 | (2011.01) |
| H03M 1/00 | (2006.01) |
| H04N 3/14 | (2006.01) |
| G01J 1/44 | (2006.01) |

(52) U.S. Cl.
CPC .............. *H01L 27/146* (2013.01); *H03M 1/12* (2013.01); *H04N 5/335* (2013.01); *H03M 1/00* (2013.01); *H04N 3/155* (2013.01); *H03M 1/56* (2013.01); *H01L 27/14643* (2013.01); *G01J 1/44* (2013.01); *H04N 5/378* (2013.01)

(58) Field of Classification Search
CPC ............ H03M 1/56; H03M 1/12; H03M 1/00; H04N 5/335; H04N 5/378; H04N 3/155; H01L 27/14643; G01J 1/44

USPC .......... 341/169, 155, 122; 348/294, 311, 312, 348/300, 302, 308; 250/208.1, 206
See application file for complete search history.

(56) References Cited

U.S. PATENT DOCUMENTS

2013/0062503 A1* 3/2013 Saito et al. ................ 250/208.1

FOREIGN PATENT DOCUMENTS

| KR | 1020090069803 A | 7/2009 |
|---|---|---|
| KR | 1020090072870 A | 7/2009 |

OTHER PUBLICATIONS

Martijn F. Snoeij et al., "Multiple-Ramp Column-Parallel ADC Architectures for CMOS Image Sensors," IEEE Journal of Solid-State Circuits, Dec. 2007, pp. 2968-2977, vol. 42, No. 12, IEEE.

* cited by examiner

*Primary Examiner* — Joseph Lauture
(74) *Attorney, Agent, or Firm* — William Park & Associates Ltd.

(57) ABSTRACT

An image sensor includes, inter alia: a first and second capacitors arranged serially between an input terminal and a first node, a first comparing unit connecting to a first reference signal and a connecting node of the first and second capacitors, and an output terminal connecting to the first node wherein the first comparing unit provides first or second preliminary ramp signals on the first node, first and second switches arranged between the first comparing unit and the first capacitor to selectively connect the first capacitor to a ground voltage or the input terminal, a third capacitor connecting to the second capacitor in parallel, a third switch selectively connecting the first node to the third capacitor, a first ramp signal output unit generating a first ramp signal with the first preliminary ramp signal provided, and a second ramp signal output unit generating a second ramp signal using the second preliminary ramp signal.

20 Claims, 7 Drawing Sheets

IMAGE SENSOR

CROSS-REFERENCE(S) TO RELATED APPLICATIONS

The present application claims priority of Korean Patent Application No. 10-2012-0034532 on Apr. 3, 2012, which is incorporated herein by reference in its entirety.

BACKGROUND OF THE INVENTION

1. Field of Invention

Various embodiments of the present invention relate to an integrated circuit, and more particularly, to an image sensor.

2. Related Art

In general, an image sensor refers to a device which captures an image by using semiconductor properties that respond to light. charge coupled device (CCD) image sensors have been widely used. However, as complementary metal oxide semiconductor (CMOS) technology has made rapid progress, an image sensor using CMOS has been developed. As compared to a conventional CCD image sensor, CMOS image sensors have an advantage in that analog circuits, which include pixel arrays, and digital control circuits can be directly implemented on a single integrated circuit (IC).

An image sensor has as many comparators as the number of columns of a pixel array. Since the comparator is a circuit requisite to convert a pixel signal into a digital signal, it affects the quality of an output image. The comparator receives a ramp signal and a data signal, i.e., a pixel signal related to an image provided from an individual pixel. The ramp signal gradually decreases at a constant rate. The comparator compares the data signal with the ramp signal to output values that are stored as an image. Therefore, it is important to generate a reliable ramp signal from an internal ramp signal generation circuit so that an image sensor can store a reliable image.

SUMMARY OF THE INVENTION

An embodiment of the present invention is directed to an image sensor including an improved ramp signal generation circuit.

In accordance with an embodiment of the present invention, an image sensor includes the following: first and second capacitors arranged serially between an input terminal and a first node, a first comparing unit having a positive input terminal connecting to a first reference signal, a negative input terminal connecting to a connecting node between the first and second capacitors, an output terminal connecting to the first node wherein the first comparing unit provides a first preliminary ramp signal or a second preliminary ramp signal on the first node, first and second switches arranged between the input terminal and the first capacitor to selectively connect the first capacitor to a ground voltage or to the input terminal, a third capacitor connecting to the second capacitor in parallel, a third switch selectively connecting the first node to the second capacitor, a first ramp signal output unit generating a first ramp signal using the first preliminary ramp signal provided, and a second ramp signal output unit generating a second ramp signal using the second preliminary ramp signal provided.

In accordance with another embodiment of the present invention, an image sensor includes an integrator, comprising of a first loading element in order to provide a preliminary ramp with an increase or decrease step, a second loading element selectively connected with the first loading element in parallel to change the step width of the preliminary ramp signal, and a ramp signal output unit in order to provide first and second ramp signals with the preliminary ramp signal, wherein the second ramp signal is generated while the second loading element is connected to the first loading element.

In accordance with another embodiment of the present invention, a method for operating an image sensor includes generating a first ramp signal with an increase or decrease step, receiving a data signal from a pixel array, searching for a step of the first ramp signal corresponding to a level of the data signal, generating a second ramp signal having a second step different from the first increase or decrease step, searching for a step of the second ramp signal corresponding to a level of the data signal wherein the searched step of the first ramp signal is referred to as a base level when the step of the second ramp signal is searched, and determining a digital value corresponding to the searched steps of the first and second ramp signals.

DESCRIPTION OF SPECIFIC EMBODIMENTS

Figure 1:
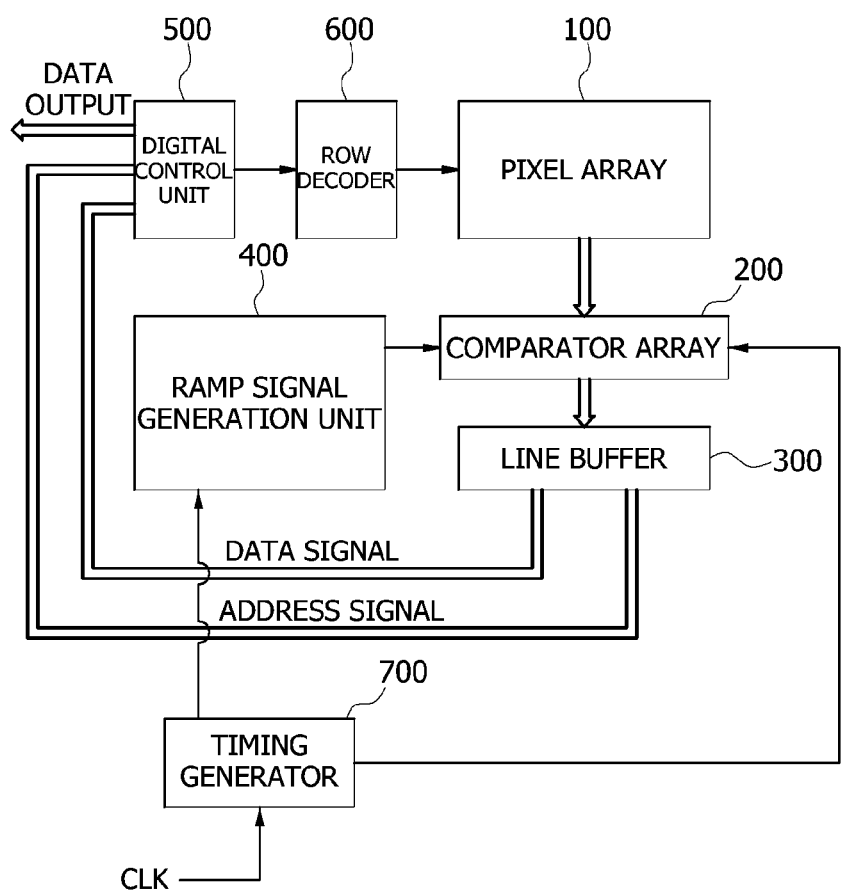
FIG. 1 is a block diagram illustrating an overall configuration of an image sensor that may be used with an embodiment of the invention.

Various embodiments of the present invention will be described below in more detail with reference to the accompanying drawings. The present invention may, however, be embodied in different forms and should not be constructed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

FIG. 1 is a block diagram illustrating an overall configuration of an image sensor that may be used with an embodiment of the invention, and is presented for explaining the present invention.

Referring to FIG. 1, a CMOS image sensor includes a pixel array 100, a comparator array 200, a line buffer 300, a ramp signal generation unit 400, a digital control unit 500, a row decoder 600, and a timing generator 700. The pixel array 100 includes a plurality of unit pixels arranged therein. The comparator array 200 includes a plurality of comparators arranged therein to compare an analog output voltage from the pixel array 100 with a ramp signal in order to convert a pixel signal into a digital value signal. The line buffer 300 includes a latch array which stores a digital signal corresponding to an output signal of the comparator array 200. The ramp signal generation unit 400 generates the ramp signal and outputs the ramp signal to the comparator array 200. The digital control unit 500 generates a control signal for the above-described blocks. The row decoder 600 selects a specific row of the pixel array 100 in response to the control signal generated from the digital control unit 500.

The comparator array 200 includes as many comparators as the number of columns of the pixel array 100. The respective comparators convert analog pixel values of columns into digital values. The converted digital signals are stored in the line buffer 300 that correspond to the columns of the pixel array 100. The digital pixel signals stored in the line buffer 300 are image-processed by the digital control unit 500 and then outputted in sequence. The ramp signal generation unit 400 generates the ramp signal and provides the ramp signal to the comparators included in the comparator array 200.

The timing generator 700 receives a clock signal CLK and generates a control signal required for the operation of the blocks inside the image sensor. For example, the timing generator 700 provides the ramp signal generation unit 400 with the control signal for generating the ramp signal so that the ramp signal generation unit 400 can output the ramp signal at a predefined time.

Figure 2:
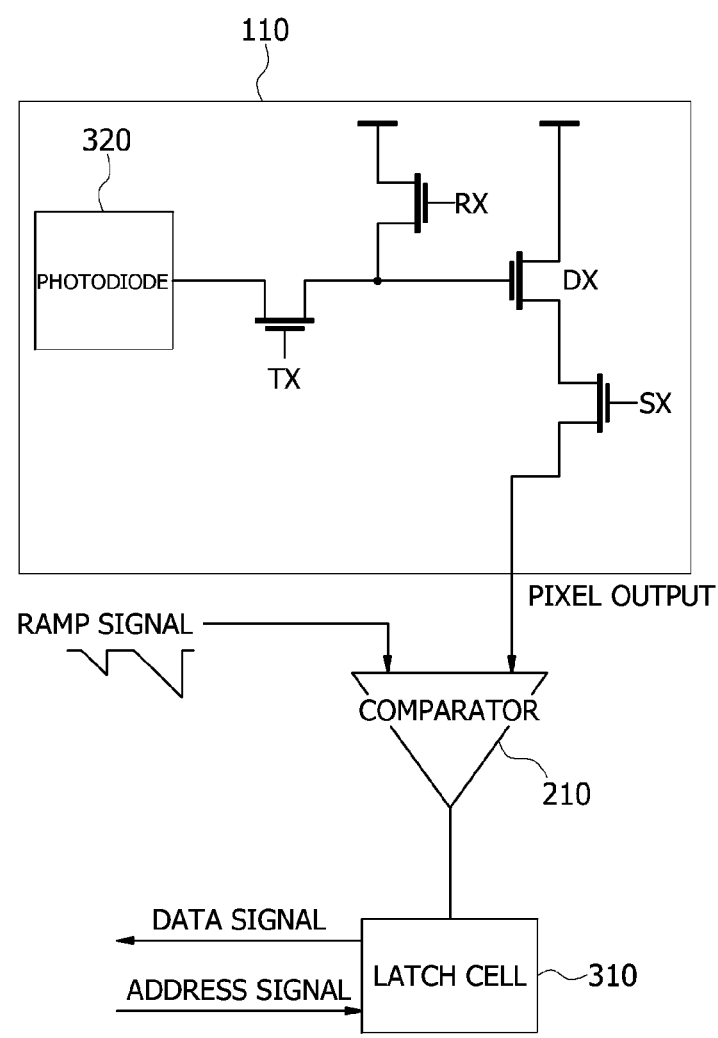
FIG. 2 schematically illustrates a procedure for converting an output signal of a unit pixel into a digital signal and storing the digital signal in the line buffer of the image sensor of FIG. 1.

FIG. 2 schematically illustrates a procedure for converting an output signal of a unit pixel into a digital signal and storing the digital signal in the blocks of the image sensor of FIG. 1. A unit pixel 110 is one of the plurality of pixels provided in the pixel array 100, and a comparator 210 is one of the plurality of comparators provided in the comparator array 200. A latch cell 310 is one of a plurality of latch cells provided in the line buffer 300.

The unit pixel 110 includes a photodiode 320, a transfer transistor Tx, a drive transistor Dx, a reset transistor Rx, and a select transistor Sx. The photodiode 320 accumulates an amount of charges corresponding to incident light. The transfer transistor Tx transfers the charges accumulated in the photodiode 320. The drive transistor Dx acts as a source follower. The drive transistor Dx receives at its gate a voltage corresponding to the charges from the photodiode 320. The charge at the gate of the drive transistor Dx controls current flow in the drive transistor Dx. The reset transistor Rx applies a reset voltage to the gate of the drive transistor Dx. The select transistor Sx provides the comparator 210 with the current transferred from the drive transistor Dx. The current provided to the comparator 210 is an input signal of the comparator 210.

The comparator 210 compares the ramp signal with the output signal of the unit pixel. The latch cell 310 stores a digital value corresponding to the output signal of the comparator 210 and outputs the digital value in response to an address signal.

Figure 3:
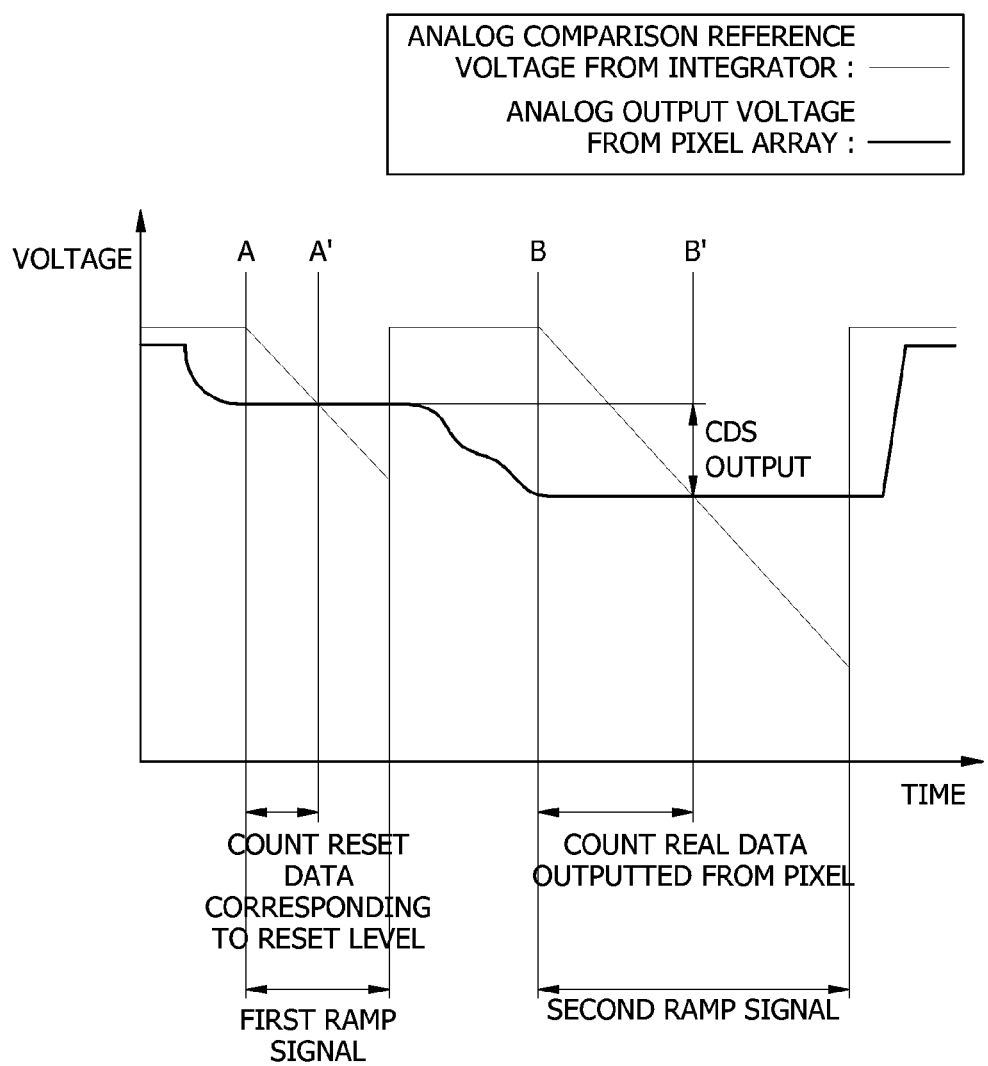
FIG. 3 is a waveform diagram illustrating the comparison result obtained when a ramp signal is compared with a pixel voltage by using digital double sampling in a comparator of an image sensor.

FIG. 3 is a waveform diagram illustrating the comparison result obtained when the ramp signal is compared with the pixel voltage by using digital double sampling in the comparator of the image sensor.

Referring back to FIG. 2, the reset transistor Rx of the unit pixel 110 is turned on, and the reset voltage at the gate of the transfer transistor Tx then turns off the transfer transistor Tx. Subsequently, the select transistor Sx is turned on. Thus, a signal corresponding to a reset level is an input to a positive (+) input terminal of the comparator 210, and a first ramp signal is an input to a negative (−) input terminal of the comparator 210. The two input signals are continuously compared by the comparator 210. A digital value corresponding to the ramp signal is recorded in the latch cell 310 until the voltage of the ramp signal becomes lower than the voltage of the signal corresponding to the reset level, which is an input to the positive (+) input terminal of the comparator 210. The ramp signal is a signal that decreases at a constant rate. When the first ramp signal is outputted, a counter (not shown) begins to count a clock pulse. A digital value is counted until the output signal of the comparator 210 is generated. The outputted digital value is stored as a first digital value in the corresponding latch cell 310. The counting begins at a point A of FIG. 3, and a digital value counted until a point A' is stored in the latch cell 310.

Subsequently, when the reset transistor Rx of the unit pixel 110 is turned off and the transfer transistor Tx and the select transistor Sx of the unit pixel 110 are turned on, the photodiode 320 accumulates charges according to intensity of external light. A signal corresponding to the charges accumulated in the photodiode 320 is an input to the positive (+) input terminal of the comparator 210, and a second ramp signal is an input to the negative (−) input terminal of the comparator 210. The comparator 210 compares the two input signals. When the voltage of the ramp signal is lower than the input voltage provided from the unit pixel to the positive (+) input terminal of the comparator 210, a digital value is counted until the output signal of the comparator 210 is generated. The outputted digital value is stored as a second digital value in the latch cell 310. The counter begins to count from a point B to a point B', and a digital value counted until a point B' is stored in the latch cell 310. Subsequently, the output signal of the comparator 210 is generated.

A final image digital value generated from the image sensor is the difference of the two stored digital values. In this manner, it is possible to eliminate an offset, i.e. an offset the comparator or the like may have, which may occur due to a processing error of the pixel array or during a procedure for converting an analog value into a digital value. In addition, the first ramp signal illustrated in FIG. 3 is a signal for obtaining a digital value which coincides with an output voltage of each unit pixel when the unit pixel is reset, and the second ramp signal is a signal for obtaining a digital value corresponding to a data signal provided from each unit pixel.

As described above, the ramp signal in the image sensor is an important waveform in order to ensure the reliability of operation. Hence, the operation characteristic of the ramp signal generation circuit outputting the ramp signal affects the operation characteristic of the CMOS image sensor.

The number of bits for each pixel in an image has to increase as much as possible for an image sensing device to produce a high definition image. As the number of bits increases, the number of steps within the ramp signal also increases. For example, if the number of bits is six, the ramp signal has 64 steps and if the number of bits is ten, the ramp signal has 1024 steps. However, it is not easy to design a ramp signal generating circuit where the ramp signal has 1024 steps.

An image sensing device has two ramp signal generating circuits which generate different ramp signals. One ramp signal generating circuit generates a first ramp signal having a larger step than a second ramp signal that is generated by a second signal generating circuit. The first ramp signal is used for determining a predetermined high digital value out of the number of bits and the second ramp signal is used for determining a predetermined low digital value out of the number of bits. For instance, in a case where the total number of bits is 10, both of the first ramp signal and the second ramp signal have 5 bits, and thus 32 steps each. A high 5 bits is determined using the first ramp signal and a low 5 bits is determined using the second ramp signal. It may be decided that one step of the first ramp signal encompassing a partial width of the first ramp signal corresponds to that of the second ramp signal encompassing the total available width of the second ramp signal.

As described above, the method of using two ramp signals can allow an image sensing device to utilize effective circuits which can reliably generate a 10-bit digital value without generating a ramp signal having 1024 steps.

Figure 4:
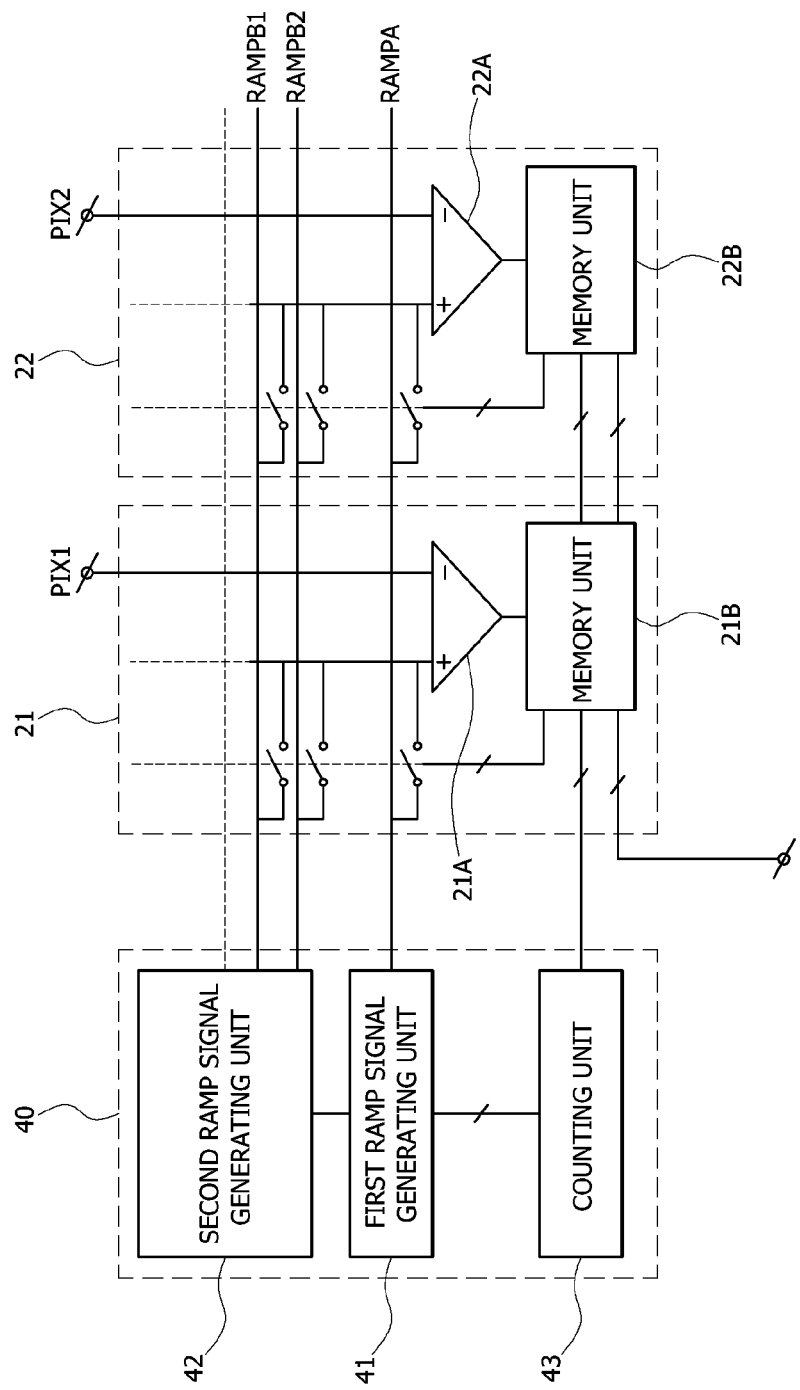
FIG. 4 is a ramp signal generation circuit referred to in FIG. 1.
Figure 5:
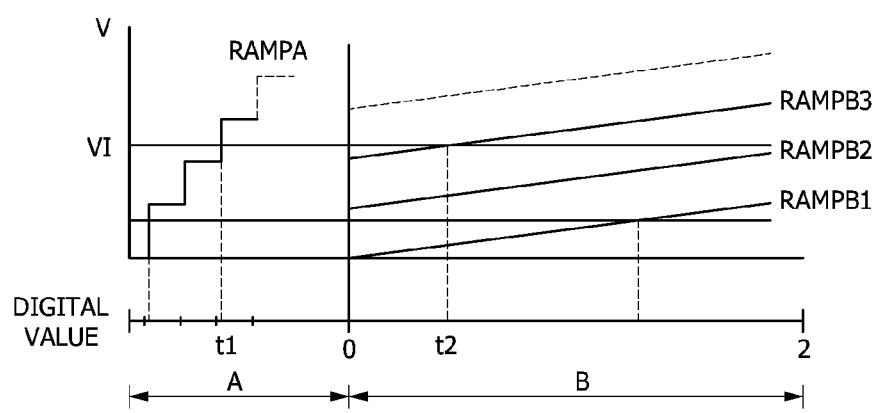
FIG. 5 is a waveform diagram illustrating the operation of the ramp signal generation circuit referred to in FIG. 4.

FIG. 4 is a ramp signal generation circuit referred in FIG. 1 and FIG. 5 is a waveform diagram illustrating the operation of the ramp signal generation circuit of FIG. 4.

As shown, an image sensing device includes a ramp signal output unit 40, a first column circuit 21, and a second column circuit 22. Herein, two column circuits are shown but more column circuits corresponding to the number of columns in a pixel array of the image sensing device may be arranged. The ramp signal output unit 40 includes a first ramp signal output unit 41, a second ramp signal output unit 42, and a counting unit 43.

The first ramp signal output unit 41 generates a first ramp signal RAMPA, and second ramp signal output unit 42 generates second ramp signals RAMPB1, RAMPB2, . . . ,. The counting unit 43 generates a counting signal that is a reference signal for generating the first and second ramp signals in the first ramp signal output unit 41 and the second ramp signal output unit 42, respectively. The first column circuit 21 includes a comparing unit 21A, a memory unit 21B, and switching units for selecting RAMPA, RAMPB1, and RAMPB2. The second column circuit 22 includes a comparing unit 22A, a memory unit 22B, and switching units for selecting RAMPA, RAMPB1, and RAMPB2.

Figure 6:
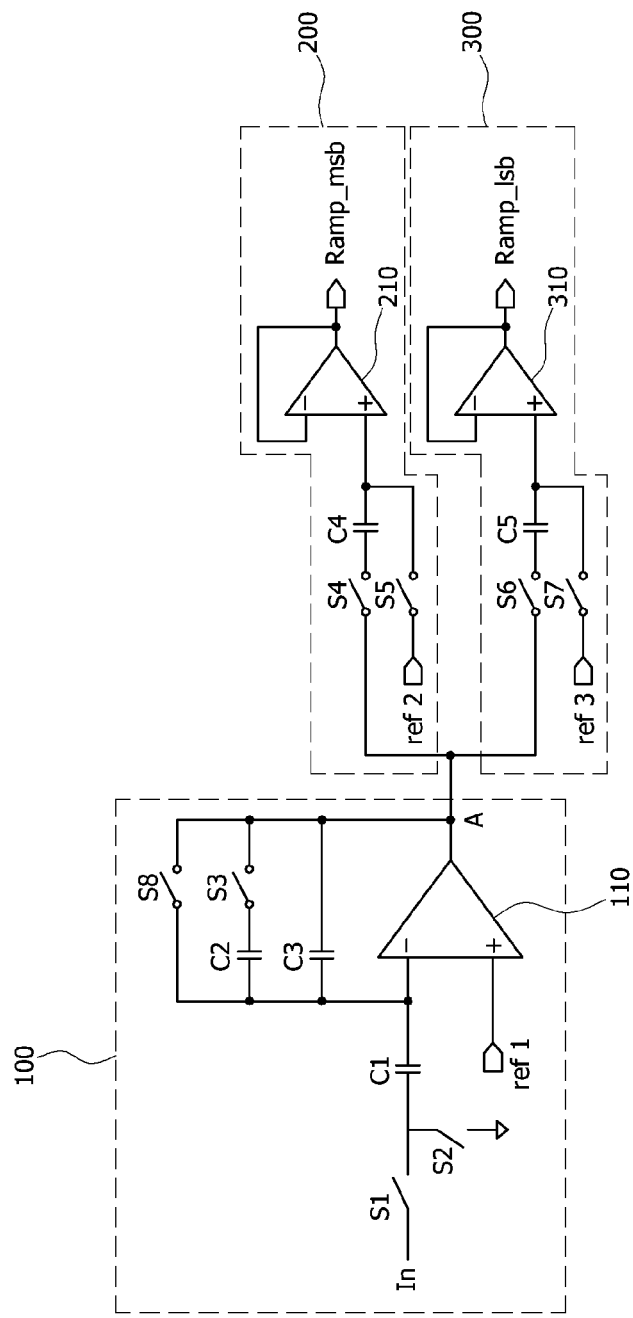
FIG. 6 is a block diagram illustrating the ramp signal generation circuit in accordance with an embodiment of the present invention.

FIG. 6 is a block diagram illustrating a ramp signal generation circuit in accordance with an embodiment of the present invention.

As shown, the ramp signal generation circuit includes a ramp signal output unit 100, a first ramp signal output unit 200, and a second ramp signal output unit 300.

The ramp signal output unit 100 includes switches S1-S3 and S8, a comparing unit 110, and capacitors C1-C3. The switches S1-S2 and the capacitors C1-C3 constitutes an integrator. The switch S8 is arranged for a reset operation of the ramp signal output unit 100.

The ramp signal output unit 100 needs to be reset before generating a ramp signal, and by having the switch S8 turned on, the comparing unit 110 is reset since a short exists between the negative input terminal (−) of the comparing unit 110 and a node A.

Switch S3 is turned off when the first ramp signal Ramp_msb is generated, and is turned on when the second ramp signal Ramp_Isb is generated. When switches S1 and S2 are alternatively turned on or off with S3 turned off, a first preliminary ramp signal is generated and transferred to node A. Herein, one step of the first preliminary ramp signal is determined depending on a ratio of the capacitor C1 and capacitor C3.

If switch S3 is turned on, a second preliminary ramp signal is generated and transferred to node A. Herein, one step of the second preliminary ramp signal is determined depending on a ratio of the capacitor C1 and a capacitance determined by the capacitors C2 and C3.

The first ramp signal output unit 200 includes switches S4 and S5, a capacitor C4, and a comparing unit 210. The switches S4 and S5 are turned on when the first ramp signal Ramp_msb is generated. The first ramp signal output unit 200 generates the first ramp signal Ramp_msb using the first preliminary ramp signal transferred from node A. A reference signal ref2 is provided to a positive input terminal (+) of the comparing unit 210, which is able to adjust the operating range of the first preliminary ramp signal to a predetermined operating range of the first ramp signal Ramp_msb.

The second ramp signal output unit 300 includes switches S6 and S7, a capacitor C5, and a comparing unit 310. The switches S6 and S7 are turned on when the second ramp signal Ramp_Isb is generated. The second ramp signal output unit 300 generates the second ramp signal Ramp_Isb using the second preliminary ramp signal transferred from node A. A reference signal ref3 is provided to a positive input terminal (+) of the comparing unit 310, which is able to adjust the operating range of the second preliminary ramp signal to a predetermined operating range of the second ramp signal Ramp_Isb.

Figure 7:
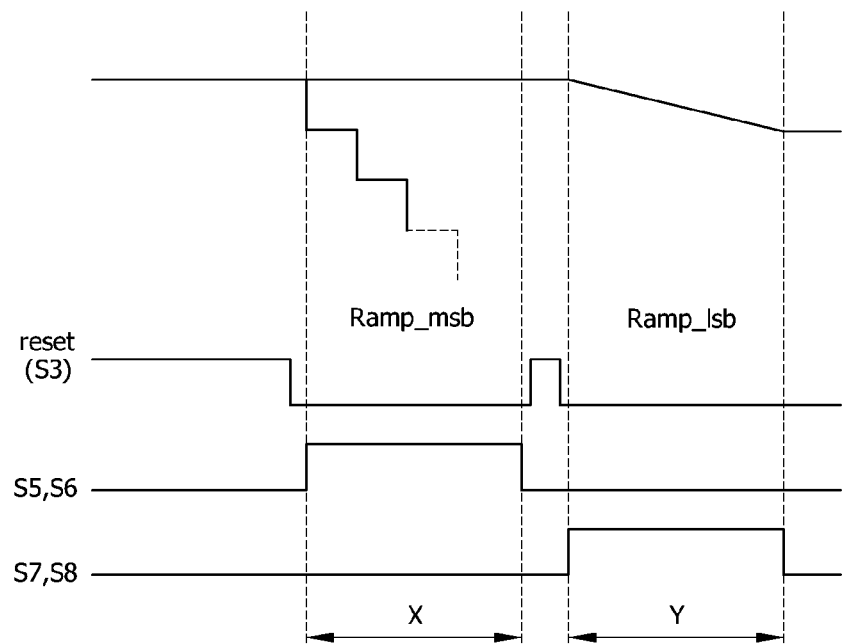
FIG. 7 is a waveform diagram illustrating the operation of the ramp signal generation circuit referred to in FIG. 6.

FIG. 7 is a waveform diagram illustrating the operation of the ramp signal generation circuit of FIG. 6.

When the switches S1 and S8 are turned on, the reset signal is set to high, and node A is set to the level of the input signal In. The switches S4 and S5 are turned on and the switches S6 and S7 are turned off when the first ramp signal Ramp_msb is generated, as denoted by period X. The second ramp signal Ramp_Isb keeps a predetermined level during X. The switches S6 and S7 are turned on and the switches S4 and S5 are turned off when the second ramp signal Ramp_Isb is generated, as denoted by period Y.

After the reference signal ref1 and the input signal In are inputted, the switches S1 and S2 are alternately turned on, which indicates that the ramp signal output unit 100 serves as an integrator and a first preliminary ramp signal with a step increase signal is provided at node A. The first ramp signal output unit 200 generates the first ramp signal Ramp_msb using the first preliminary ramp signal.

When the first ramp signal Ramp_msb is generated, the reference signal ref2 is provided and the switches S4 and S5 are turned on. The reference signal ref2 is a signal for adjusting the operating range of the first ramp signal Ramp_msb. The reference signal ref2 may change the operating range of the comparing unit 210.

When generating the second ramp signal Ramp_Isb, the switches S3, S6, and S7 are turned on. After the reference signal ref1 and input signal In are inputted, the switches S1 and S2 are alternately turned on. The ramp signal output unit 100 serves as an integrator and a second preliminary ramp signal with a step increase different from the first preliminary ramp signal is provided at node A. Because the switch S3 is turned on, the operation of the ramp signal output unit 100 serving as an integrator is changed. That is, the capacitance of the integrator is changed. Capacitor C2 is used for generating the second ramp signal Ramp_Isb. The one step of the second ramp signal Ramp_Isb may be determined depending on an adapted image sensing device. For instance, as in FIG. 7, the available range of the second ramp signal Ramp_Isb, i.e. Y, may have the same one step drop as in the first ramp signal Ramp_msb. This is possible by adjusting the capacitance of the capacitors C1, C2 and C3.

The second ramp signal output unit 300 generates the second ramp signal Ramp_Isb using the second preliminary ramp signal provided on node A.

When the second ramp signal Ramp_Isb is generated, the reference signal ref3 is provided and the switches S6 and S7 are turned on. The reference signal ref3 is a signal for adjusting the operating range of the second ramp signal Ramp_Isb. The reference signal ref3 may change the operating range of the comparing unit 310.

A reset signal may be generated and subsequently, node A may be reset after generating the first ramp signal Ramp_msb.

As described above, the ramp signal generation circuit in accordance with an embodiment of the present invention uses an integrator with a plurality of capacitors and can generate more than one ramp signal by adjusting the overall capacitance of the integrator.

If an image sensing device needs multiple ramp signals, the image sensing device does not need to include multiple ramp signal generating circuits. One ramp signal generating circuit according to the present invention can provide multiple ramp signals. Thus, the required area for an image sensing device can be reduced and there are no problems regarding mismatch among multiple ramp signal generating circuits.

While the present invention has been described with respect to the specific embodiments, it will be apparent to those skilled in the art that various changes and modifications may be made without departing from the spirit and scope of the invention as defined in the following claims.

What is claimed is:

1. An image sensor comprising:
a first capacitor and a second capacitor arranged between an input terminal and a first node;
a first comparing unit having a positive input terminal connecting to a first reference signal, a negative input terminal connecting to a connecting node of the first capacitor and the second capacitor, and an output terminal connecting to the first node wherein the first comparing unit provides a first preliminary ramp signal or a second preliminary ramp signal on the first node;
a first switch and a second switch arranged between the input terminal and the first capacitor to selectively connect the first capacitor to a ground voltage or the input terminal;
a third capacitor connecting to the second capacitor in parallel;
a third switch selectively connecting the first node to the third capacitor;
a first ramp signal output unit generating a first ramp signal by using the first preliminary ramp signal when the first preliminary ramp signal is provided; and
a second ramp signal output unit generating a second ramp signal by using the second preliminary ramp signal when the second preliminary ramp signal is provided.

2. The image sensor of claim 1, wherein the operating range for one step of the second preliminary ramp signal is equal to that of one step of the first preliminary ramp signal.

3. The image sensor of claim 2, wherein the first ramp signal output unit includes:
a fourth capacitor;
a fourth switch selectively connecting the first node to the fourth capacitor;
a second comparing unit having a negative terminal connecting to its output terminal and a positive terminal connecting to the fourth capacitor;
a fifth switch selectively connecting a second reference signal to the positive terminal of the second comparing unit; and
a first output signal.

4. The image sensor of claim 3, wherein the second ramp signal output unit includes:
a fifth capacitor;
a sixth switch selectively connecting the first node to the fifth capacitor;
a third comparing unit having a negative terminal connecting to its output terminal and a positive terminal connecting to the fifth capacitor;
a seventh switch selectively connecting a third reference signal to the positive terminal of the third comparing unit; and
a second output signal.

5. The image sensor of claim 4, wherein one step of the first output signal encompassing a partial width of the first ramp signal corresponds to that of the second output signal encompassing the total available width of the second ramp signal.

6. The image sensor of claim 1, further comprising an eighth switch selectively connecting a first node to the negative terminal of the first comparing unit to provide a reset value on the first node.

7. An image sensor comprising:
An integrator including a first loading element to provide a preliminary ramp signal with an increase or decrease step;
a second loading element selectively connected with the first loading element in parallel to change a step width of the preliminary ramp signal;
a ramp signal output unit generating a first ramp signal and a second ramp signal with the preliminary ramp signal wherein the second ramp signal is generated while the second loading element is connected with the first loading element.

8. The image sensor of claim 7, wherein the operating range of the second ramp signal is equal to that of one step of the first ramp signal.

9. The image sensor of claim 8, wherein the second loading element includes a capacitor.

10. The image sensor of claim 7, wherein the integrator includes:
a first capacitor and a second capacitor arranged serially between an input terminal and the output terminal of the integrator;
a first comparing unit having a positive input terminal connecting to a first reference signal, a negative input terminal connecting to a connecting node of the first capacitor and the second capacitor, and an output terminal connecting to the output terminal of the integrator wherein the first comparing unit provides the preliminary ramp signal; and
a first switch and second switch arranged between the input terminal and the first capacitor to selectively connect the first capacitor to a ground voltage or the input terminal.

11. The image sensor of claim 10, wherein the second loading element includes:
a third capacitor arranged with the second capacitor in parallel; and
a third switch connecting the output terminal of the integrator to the second capacitor.

12. The image sensor of claim 11, wherein the ramp signal output unit includes:
a first ramp signal output unit generating a first ramp signal using the preliminary ramp signal provided on the output terminal of the integrator and a second ramp signal output unit generating a second ramp signal using the preliminary ramp signal provided on the output terminal of the integrator when the second loading element is connected,
wherein the first ramp signal output unit includes a fourth capacitor;
a fourth switch selectively connecting the output terminal of the integrator to the fourth capacitor;
a second comparing unit having a negative terminal connecting to its output terminal and a positive terminal connecting to the fourth capacitor;

a fifth switch selectively connecting a second reference signal to the positive terminal of the second comparing unit; and
a first output signal.

13. The image sensor of claim 12, wherein the second ramp signal output unit includes:
a fifth capacitor;
a sixth switch selectively connecting the output terminal of the integrator to the fifth capacitor;
a third comparing unit having a negative terminal connecting to its output terminal and a positive terminal connecting to the fifth capacitor; and
a seventh switch selectively connecting a third reference signal to the positive terminal of the third comparing unit; and
a second output signal.

14. The image sensor of claim 13, wherein one step of the first output signal encompassing a partial width of the first ramp signal corresponds to that of the second output signal encompassing the total available width of the second ramp signal.

15. The image sensor of claim 11, further comprising an eighth switch selectively connecting the output terminal of the integrator to the negative terminal of the first comparing unit to provide a reset value on the first node.

16. A method for operating an image sensing device, comprising:
generating a first ramp signal having a first increase or decrease step;
receiving a data signal from a pixel array;
searching for a step of the first ramp signal corresponding to a level of the data signal;
generating a second ramp signal having a second step different from the first increase or decrease step; and
searching for a step of the second ramp signal corresponding to a level of the data signal wherein the searched step of the first ramp signal is referred to as a base level when the step of the second ramp signal is searched; and
determining a digital value corresponding to the searched steps of the first and second ramp signals.

17. The method of claim 16, wherein the operating range of the second ramp signal is equal to that of one step of the first ramp signal.

18. The method of claim 16, wherein both of the first ramp signal and the second ramp signal are generated by an adjusted output of an integrator.

19. The method of claim 18, wherein the integrator is reset after the first ramp signal is generated.

20. The method of claim 18, wherein the integrator is of a switched capacitor type and the first ramp signal and the second ramp signal are generated depending on a capacitance variance of the switched capacitor type.

* * * * *